United States Patent [19]

Shibata

[11] 4,232,439
[45] Nov. 11, 1980

[54] MASKING TECHNIQUE USABLE IN MANUFACTURING SEMICONDUCTOR DEVICES

[75] Inventor: Hiroshi Shibata, Kawasaki, Japan

[73] Assignee: VLSI Technology Research Association, Kawasaki, Japan

[21] Appl. No.: 855,639

[22] Filed: Nov. 29, 1977

[30] Foreign Application Priority Data

Nov. 30, 1976 [JP] Japan ................................ 51-142918
Nov. 30, 1976 [JP] Japan ................................ 51-142919
Dec. 31, 1976 [JP] Japan ................................ 51-158060

[51] Int. Cl.³ .............................................. B01J 17/00
[52] U.S. Cl. .................................... 29/579; 29/576 B; 29/584; 357/91
[58] Field of Search ................... 29/579, 576 B, 584; 357/91

[56] References Cited

U.S. PATENT DOCUMENTS

| | | | |
|---|---|---|---|
| 3,258,898 | 7/1966 | Garibotti | 29/576 B |
| 3,914,857 | 10/1975 | Goser | 29/579 |
| 4,086,694 | 5/1978 | U | 29/579 |

Primary Examiner—W. C. Tupman
Attorney, Agent, or Firm—Sughrue, Rothwell, Mion, Zinn and Macpeak

[57] ABSTRACT

A semiconductor layer different in material from a semiconductor substrate formed on at least one part of the surface of the substrate is partially removed in accordance with a planar configuration forming technique employing irradiation of a radiation such as light, electron beam or X-rays to form a residual layer and ion beams are applied to the upper surface or the substrate at an incidence angle less than 90 degrees so that a non-etching region is formed at the region of the substrate other than the region around and beneath said residual layer according to mutual relationships between the configuration of the residual layer and the incidence angle of the ion beams.

4 Claims, 33 Drawing Figures

MASKING TECHNIQUE USABLE IN MANUFACTURING SEMICONDUCTOR DEVICES

BACKGROUND OF THE INVENTION

This invention relates to a novel masking method for masking necessary parts of a surface of a semiconductor substrate by using resists and oblique irradiation of the surface and a method of manufacturing semiconductor devices by using the masking method.

There are a variety of semiconductor devices manufactured by selective diffusion or selective ion implantation. In a conventional selective diffusion or selective ion implantation technique, the surface of a semiconductor is coated with photo resist, and the portions thereof corresponding to windows are removed. In addition, the semiconductor oxide film exposed in the windows is removed by using an etching liquid to form a mask, and impurity diffusion or ion implantation is effected through the windows, thereby to form semiconductor regions having desired conduction types. However, in the case of forming one unitary semiconductor element, this mask formation process must be repeated several times. For instance, in manufacturing a bipolar IC, one mask is necessary for each of the buried layer diffusion, dielectric isolation diffusion, collector contact compensation diffusion, base diffusion (resistance diffusion), emitter diffusion (contact point), oxide film drilling (for electrodes) and wiring pattern processes; that is, it is necessary to repeat the mask formation seven times. In the manufacture of a MOS-IC or a planar transistor, it is necessary to repeat the mask formation at least four times. This will be described in detail with respect to the method of manufacturing a MOS transistor shown in FIG. 1, for example.

A thick $SiO_2$ layer is formed on an entire surface of a p-type Si monocrystalline substrate 1 in accordance with the ordinary thermal oxidation method for the purpose of electrically isolating unit elements from each other, and is then subjected to etching so as to selectively remove the $SiO_2$ layer leaving $SiO_2$ regions 2 as shown in FIG. 1. Then, a gate insulating oxide film 3 is formed on the substrate surface portion between the $SiO_2$ regions 2 by thermal oxidation, and a polycrystalline Si layer is formed over the entire surface by vapor growth. Furthermore, the Si layer is coated with a photosensitive agent, and is then partially subjected to a radiation such as light, electron beams or X-rays. Then, the polycrystalline Si layer is removed except the part of a gate 4, by etching. By employing this polycrystalline Si layer thus left as a mask, n-type impurities are introduced by diffusion or ion implantation, thereby to form a source region 5 and a drain region 6. Then, after a $SiO_2$ film 7 is formed over the gate 4 as shown in FIG. 2, contact holes are formed by the lithography technique at regions of the source, the drain, and the gate metal layers 8 which will be employed as electrode material and wiring material are deposited by vacuum evaporation and the lithography technique as desired.

The above described method of manufacturing MOS transistors relates, in general to self-aligned silicon gate MOS transistors. This method is extensively employed for manufacturing transistors which are relatively small in area, because in the method the gate, source and drain regions are self-aligned. Substantially the same manufacturing method as that described above is employed for manufacturing other MOS transistors.

In the case of the above-described manufacturing method, as to the number of times of mask alignment, the mask formation must be repeated five or six times for the $SiO_2$ film 2 for isolation, the gate 4, the contact holes of the source, the drain and the gate, a provision of the operation type, enhancement or depletion to the device, and the partially removal of the oxide film adapted to protect the surface after the metal film formation.

Due to the necessity of the frequent mask formations, the manufacturing process is necessarily intricate and the productivity is low. In addition, the errors in accuracy between the mask formations are accumulated, as a result of which it is necessary to have a larger margin in pattern design, which leads to an increase in area of the semiconductor device which preferably should be avoided.

Furthermore, in a method of employing the lithography technique with electron beams instead of using such a mask, direct exposure must be carried out several times. Accordingly, this method also suffers from the above-described disadvantages, and it is rather difficult to put this method in practical use because of the low accuracy and stability of the electron beam exposure device.

SUMMARY OF THE INVENTION

An object of this invention is to provide an irradiation method of semiconductor material with beams which provide a high degree of freedom in etching pattern formation, impurity diffusion and/or ion implantation.

Another object of this invention is not only to simplify the above-described mask formation process or the above-described selective pattern formation process according to the lithography technique but also to improve the alignment accuracy of various sections of the semiconductor device.

In order to achieve the above-described object, according to this invention, at least one resist is formed, as shielding substances, on the surface of a semiconductor which requires impurity diffusion, ion implantation or ion etching in correspondence to a mask pattern, and the shielding substance is employed as a pattern for impurity injection in impurity diffusion, ion implantation or ion etching. This impurity injection pattern, for instance in the case of imploying the impurity ion implantation technique, is determined by the arrangement and configuration of the shielding substance and by the incidence direction and angle of the impurity ions with respect to the resists.

DETAILED DESCRIPTION OF THE PREFERRED EMBODIMENTS

Examples of the masking method applied to the manufacture of MOS transistors will be described with reference to FIGS. 3 through 12.

Figure 1:
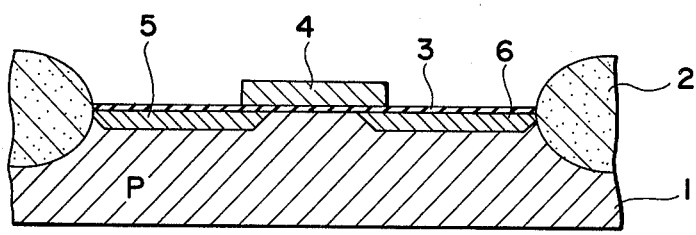
FIGS. 1 and 2 are sectional views showing a structure of a conventional MOS transistor which were described already.
Figure 2:
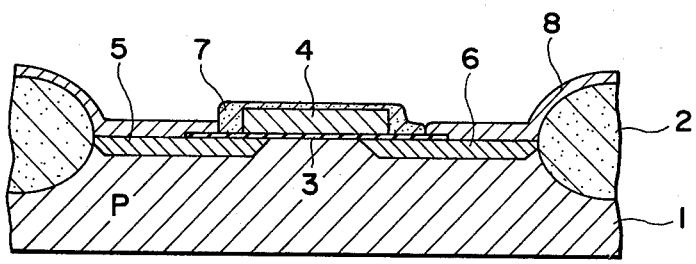
Figure 3:
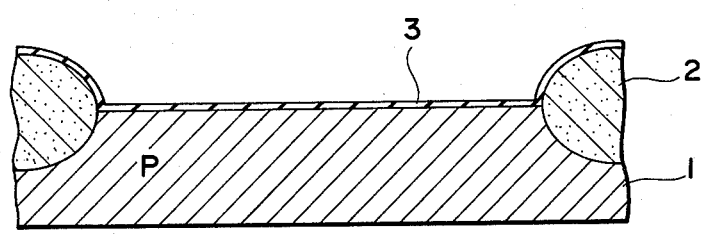
FIGS. 3 and 4 are sectional views showing initial steps of manufacturing a MOS transistor according to the present invention.

In an embodiment in FIG. 3, first thick $SiO_2$ regions 2 are formed on a p-type Si monocrystalline substrate 1 for the purpose of electrically isolating unit elements, and after etching the necessary parts thereof a gate insulating oxide film 3 is formed on the entire surface according to the conventional manufacturing method.

Figure 4:
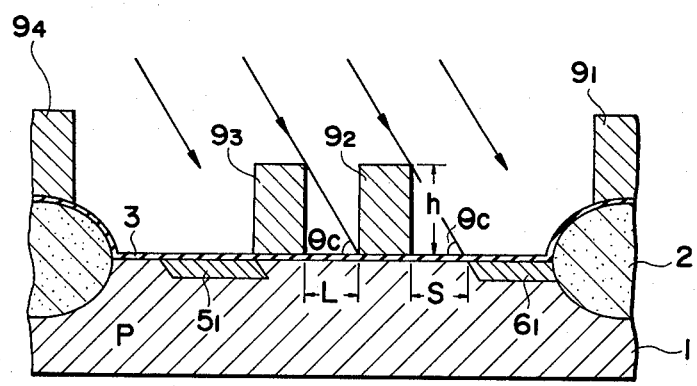

A photo-sensitive coating is provided over the gate insulating oxide film 3 on the p-type Si monocrystalline substrate 1, and thereafter resists $9_1$ through $9_4$ are formed according to a method of light exposure, electron beam exposure, or X-ray exposure as shown in FIG. 4. These resists $9_1$ through $9_4$ may be obtained by light exposure, electron beam exposure, or X-ray beam exposure from a photo-sensitive region, a contamination film, or silicone (Si) or from metals. However, it is preferable that the resists are obtained from $SiO_2$ or other non-metallic substances in view of the fact that in this MOS transistor, electrode metals are formed at the parts thereof except from the resists $9_1$ through $9_4$ and then all of the resists $9_1$ through $9_4$ are removed. In this connection, it is assumed that the height of each of the resists $9_2$ and $9_3$ is h, and the distance therebetween is L.

Then, the parallel ion beams of n-type impurities are applied to the surface of the p-type Si monocrystalline substrate 1 obliquely from the left in accordance with the ion implantation technique. This incidence angle $\theta_c$ is defined by the following equation so that the area L between the resists $9_2$ and $9_3$ is not subjected to the ion irradiation:

$$h \geq L \cdot \tan \theta_c \text{ or } \theta_c \leq \tan^{-1} h/L$$

Figure 5:
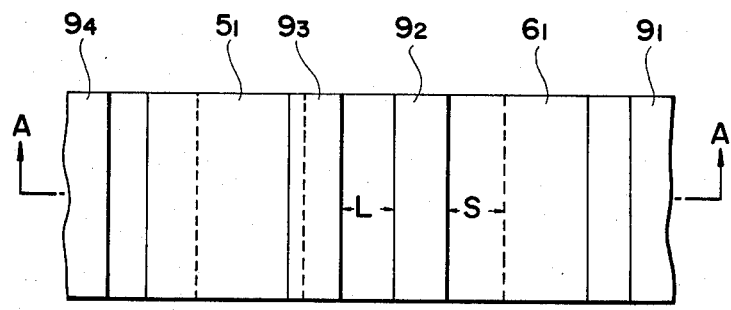
FIG. 5 is a plan view of the structure in FIG. 4.

By the parallel ion beams, the n-type impurities are introduced into a source region portion $5_1$ and into a drain region portion $6_1$. Shown in FIG. 5 is a plan view of a unit element under this condition. FIG. 4 is a sectional view taken along line A—A in FIG. 5.

Figure 6:
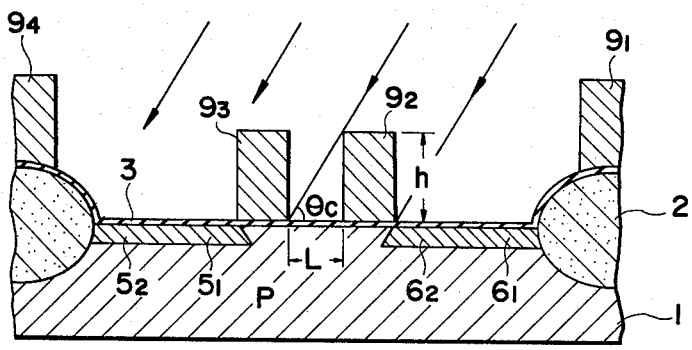
FIGS. 6 through 10 are sectional views showing subsequent steps to that in FIG. 4.

As shown in FIG. 6, the ions of n-type impurities are applied from the right thereby to form a source region portion $5_2$ and a drain region portion $6_2$. A source region and a drain region are formed by the source region portion $5_2$ and the drain region portion $6_2$ together with the previously formed source region portion $5_1$ and drain region portion $6_1$, respectively. In this ion plantation also, the ions are not implanted into the area defined by the distance L between the resists $9_2$ and $9_3$.

Figure 7:
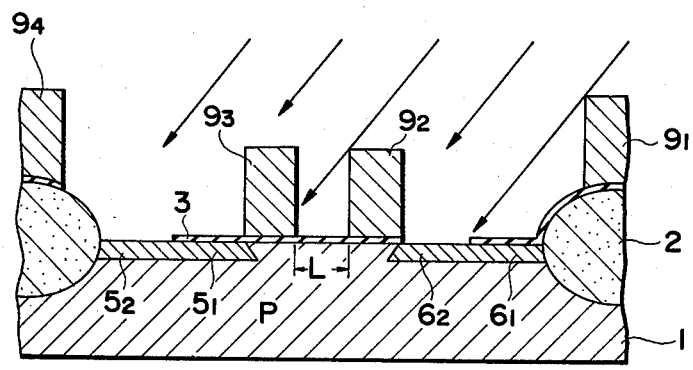

Now, as shown in FIG. 7, parallel etching ion beams are applied obliquely from the right, or at an angle smaller than $\theta_c$ by using an ion etching device, thereby to remove the polycrystalline layer and the $SiO_2$ layer 3 on the portions $5_2$ and $6_2$. In this operation, the areas corresponding to the shadows of the resists $9_2$ and $9_3$ are maintained unchanged.

Figure 8:
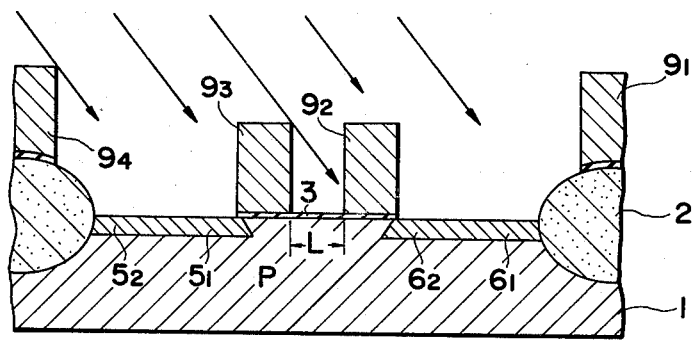

As shown in FIG. 8, parallel etching ion beams are applied at an angle smaller than $\theta_c$ from the left, thereby to remove the polycrystalline silicon layer and the $SiO_2$ layer 3 except for those beneath the resists $9_2$ and $9_3$ and the $SiO_2$ layer 3 therebetween. As a result, so-called contact holes are formed on the source region 5 and the drain region 6. The resists $9_1$ through $9_4$ may be etched at a certain etching speed by the application of the ion beams. Therefore, etching of the $SiO_2$ layer 3 between the resists $9_2$ and $9_3$ can be avoided by selecting the height h and the incidence angle $\theta_c$ suitably.

Figure 9:
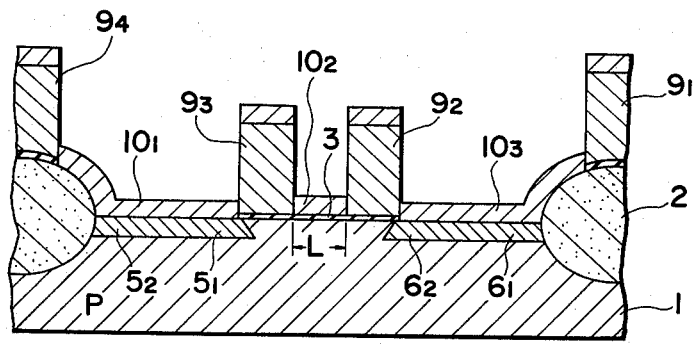

Then, a metal such as aluminum, aluminum-silicon alloy, aluminum-other-metal alloy, molybdenum, tungsten, tantalum, platinum or gold is deposited by vacuum evaporation on the entire upper surface of the p-type Si monocrystal substrate 1, thereby to form electrodes $10_1$ through $10_3$ (FIG. 9).

Figure 10:
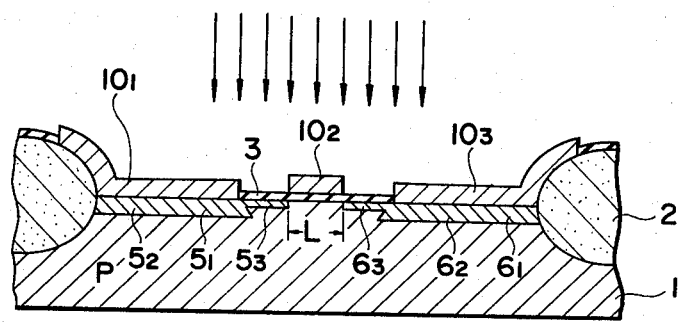

By suitably selecting materials of the resists and solvent, the resists $9_1$ through $9_4$ are selectively removed in accordance with the lift off technique as shown in FIG. 10 without damaging the substrate 1 and other portions thereon. Thereafter, n-type impurity ions are implanted, at a suitable accelerating voltage, into the regions formerly covered by the resists $9_2$ and $9_3$, as a result of which a source region portion $5_3$ and a drain region portion $6_3$ are formed.

Through the above-described manufacturing process, the source, gate and drain regions together with their electrodes can be formed by the use of only one mask, that is, the single resist pattern. Heretofore, in the manufacture of a MOS transistor of this type, it is necessary to prepare a mask for each of the gate, contact hole, and wiring stops; that is, it is necessary to repeat the mask formation three times to manufacture a MOS transistor as mentioned previously. However, according to this invention, the number of times of forming the mask is reduced to one, and accordingly the accuracy in arrangement of the source, gate and drain is high.

Figure 11:
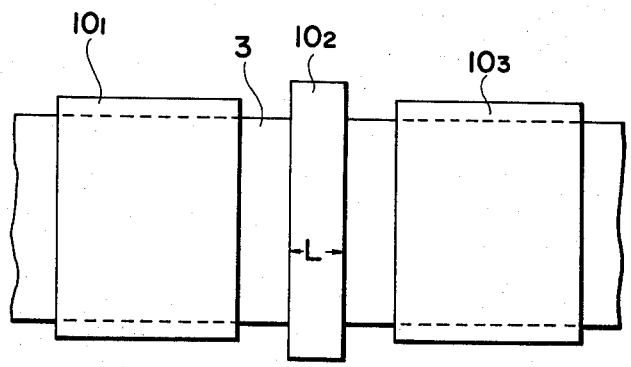
FIG. 11 is a plan view of the structure in FIG. 10.
Figure 12:
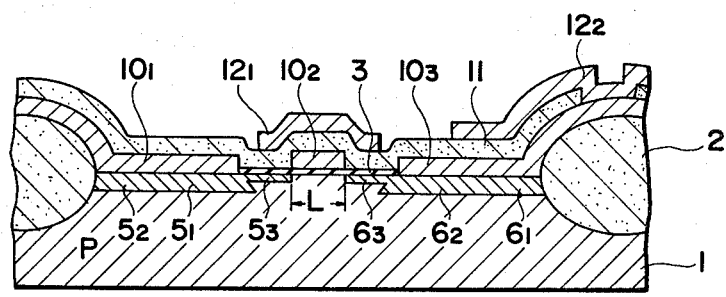
FIG. 12 is a cross section of the MOS transistor manufactured by the above steps.

FIG. 11 shows a plan view of one MOS transistor manufactured in accordance with the above-described process. In the case of one layer wiring, fundamentally the manufacture of the MOS transistor is completed by the aforementioned process. However, in the case of multi-layer wiring, as shown in FIG. 12, a $SiO_2$ layer 11 is formed so as to cover the entire upper surface of the p-type Si monocrystal substrate 1, and contact holes are provided at desired positions by the ordinary lithography technique and, in addition, metal employed as wiring material is deposited on the entire surface by vacuum evaporation so as to form multi-layer wirings $12_1$ and $12_2$ by the lithography technique.

The above-described embodiment relates to the method of manufacturing MOS transistors; however, it should be noted that the invention is not limited thereto or thereby, and the invention can be applied to the manufacture of other semiconductor devices in which selective diffusion of impurities or selective implantation of impurity ions is required.

As another embodiment, the manufacture of bipolar transistors will be described with reference to FIGS. 13 through 17.

Figure 13:
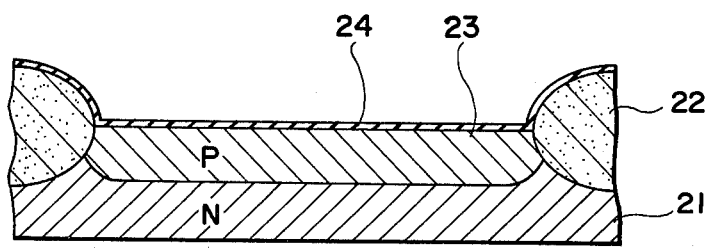
FIGS. 13 through 17 are sectional views for a description of the steps of manufacturing a bipolar transistor as a second embodiment.

As shown in FIG. 13, thick $SiO_2$ regions 22 are formed on an n-type Si monocrystalline substrate 21 for the purpose of electrically isolating the unit elements, and then after etching necessary portions thereof a p-type region 23 is formed by diffusion or ion implantation. Furthermore, a $SiO_2$ film 24 is allowed to grow on the p-type region 23.

Figure 14:
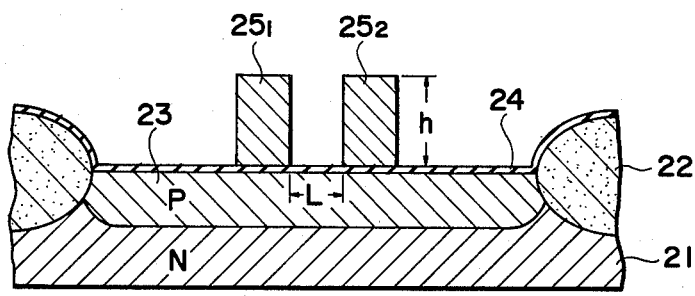

As shown in FIG. 14, the $SiO_2$ film 22 on the n-type Si monocrystalline substrate 21 is coated with a photosensitive agent, and then resists $25_1$ and $25_2$ are formed by light exposure, electron beam exposure or X-ray exposure. It is assumed that the height of each of the resists $25_1$ and $25_2$ is h, and the distance therebetween is L, as in the previous embodiment.

Then, the entire surface is implanted with ions of $n^+$ impurities such as phosphorus, arsenic or antimony for the emitter.

Figure 15:
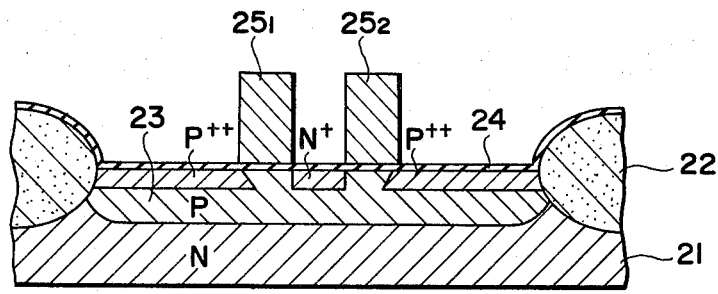

The ion implantation of $p^{++}$ impurities such as boron is effected obliquely as shown in FIG. 15, in the same manner as that described with reference to FIG. 4.

Figure 16:
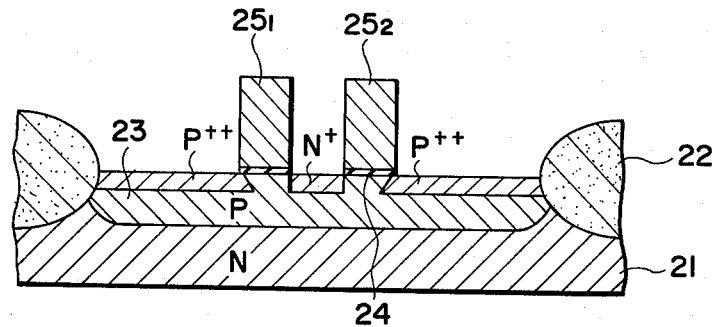
Figure 17:
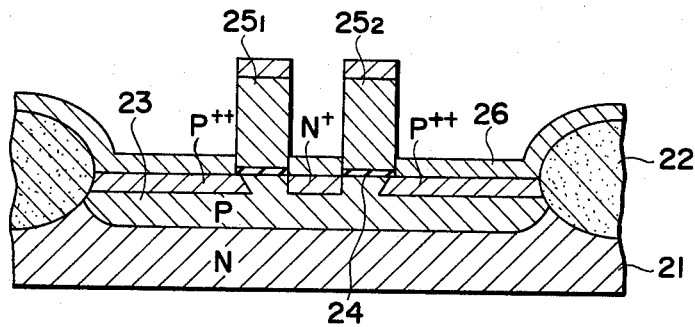

Thereafter, the $SiO_2$ film 24 is, as shown in FIG. 16, removed, and then metal 26 which will be employed as electrodes is, as shown in FIG. 17, deposited on the entire surface by vacuum evaporation in the same manner as that described with reference to FIG. 9. Thereafter, the resists $25_1$ and $25_2$ are removed in accordance with the lift off technique, and then an oxide film is formed over the entire surface. Thus, the bipolar transistor can be manufactured.

In the latter embodiment, the impurity implantation is carried out in accordance with the technique of implanting impurity ions obliquely and the etching is carried out in accordance with etching method in which ions are applied obliquely. However, it is possible that a radiation such as light, electrons or X-rays is employed instead of ions. In such case, a resist film photo-sensitive to the radiation is formed on the semiconductor substrate, the radiation is applied obliquely to the resist film to form a pattern employed as a mask, and thereafter impurity implantation is carried out in accordance with the diffusion technique or the ion implantation. Furthermore, the etching may be achieved by the method in which similarly the radiation is applied obliquely to the resist film to provide a pattern, which is employed as a mask for etching with a chemical liquid.

Alternatively, it is possible that the impurity implantation is carried out in accordance with the impurity ions obliquely implanting method, and the etching is carried out with a chemical liquid by the utilization of the resist film. Furthermore, it is possible that the impurity implantation is effected by impurity diffusion or ion implantation, while the etching is achieved by oblique ion etching. Instead of the ion implantation, the impurities may be added by depositing an organic matter.

Figure 18:
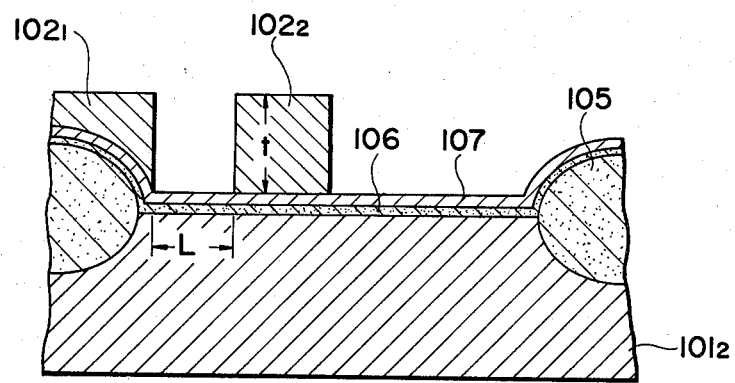
FIGS. 18 through 21 are cross sections showing a MOS transistor for a description of a third embodiment of the present invention.

Another embodiment in FIGS. 18 through 21 relates to the manufacture of diffused self aligned MOS (D-MOS) transistors. In FIG. 18, thick SiO regions 105 are formed on a p-type Si monocrystalline substrate $101_2$ at regions other than the gate, source and drain regions so as to electrically separate the parts from each other which will become unit elements, and a gate insulating film, or a SiO layer 106 is formed. Then, a metal which will be employed as the gate electrode, or a polycrystalline Si layer 107 is formed by vacuum evaporation or vapor growth so as to cover the entire surface. An agent PMMA sensitive to electron beams or a photo resist is applied onto the p-type Si monocrystalline substrate $101_2$. Then, the substrate thus treated is subjected to exposure with electron beams, light or X-rays, thereby to form ion etch resists $102_1$ and $102_2$ t in thickness and spaced apart by a distance L from each other.

Figure 19:
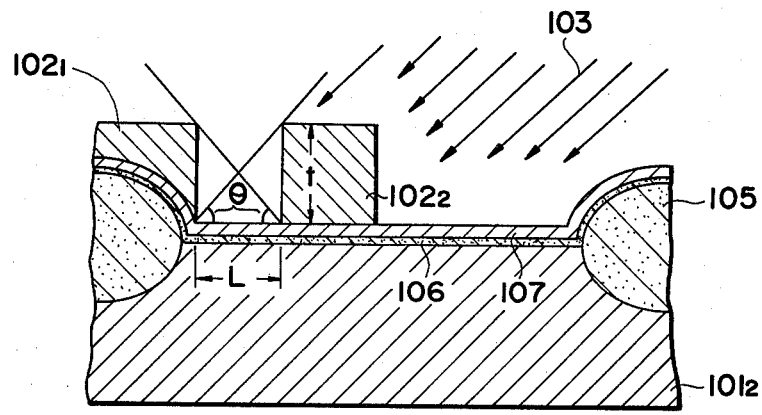

Then, as shown in FIG. 19, parallel etching ion beams 103 are applied to the substrate at an angle smaller than $\theta = \tan^{-1} t/L$ from the right, in order to remove the SiO layer 106 and the polycrystalline Si layer 107 on the right side of the ion etch resist $102_2$.

Figure 20:
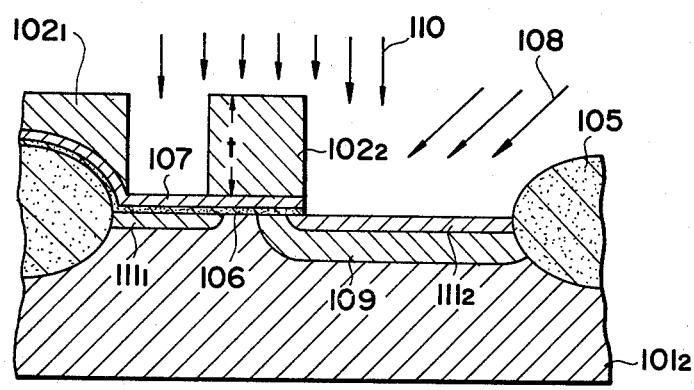

Thereafter, as shown in FIG. 20, the ion beams 110 of n-type impurities such as phosphorus are implanted into the p-type Si monocrystalline substrate $101_2$ perpendicularly thereto, thereby to form the drain region $111_1$ and the source region $111_2$.

Figure 21:
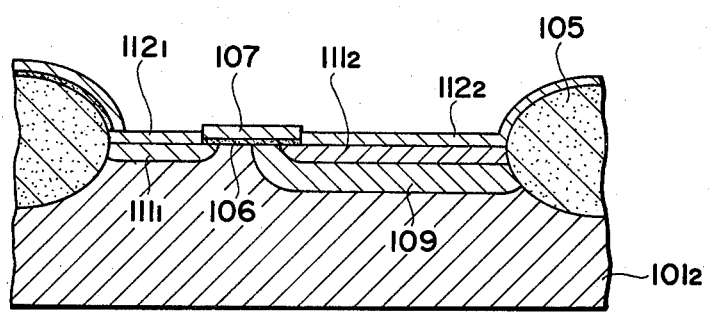

The $SiO_2$ film is removed from the surface of the drain region $111_1$, and then metals $112_1$ and $112_2$ such as aluminum are deposited by vacuum evaporation in a vertical direction, and furthermore the ion etch resists $102_1$ and $102_2$ are removed by the lift-off technique, as a result of which a wiring pattern is obtained (FIG. 21).

Then, in order to prevent electrical contacts which may occur between the metal of the gate region and the wiring metals of the source and drain regions, the metal surfaces, especially the contact portions, are isolated by oxidation thereof.

If the device described above is intended to use as an integrated circuit, it is necessary to form an oxide film on the surface thereof thereby to isolate the multiple wiring and to protect the inside thereof.

In the embodiment described above, the etching for formation of the p-type ion implantation layer 109 and the formation of the polycrystalline silicon layer 107 (FIG. 21) can be effected simultaneously. In addition, the ion etch resist can be also used as the mask for p-type ion implantation, as it is.

Figure 22:
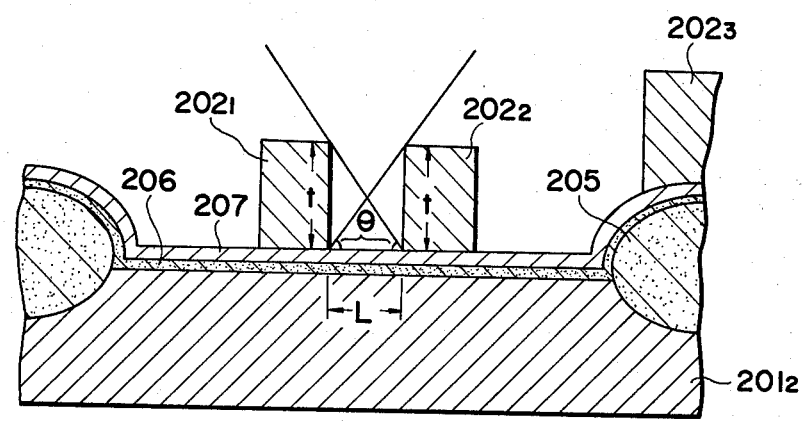
FIGS. 22 through 25 are cross sections showing a MOS transistor for a description of a fourth embodiment of the present invention.

As another embodiment, a self aligned MOS transistor will be described with reference to FIGS. 22 through 25. As shown in FIG. 22 first thick SiO regions 205 are formed on a p-type Si monocrystalline substrate $1_2$ and a gate insulating film, or a SiO 206 is formed as in the same manner as that in the previous embodiment. Then, a metal or a polycrystal Si layer 207 is similarly formed so as to cover the entire surface. Then, ion etch resists $202_1$ and $202_2$ t in thickness and spaced apart by a distance L from each other are formed.

Figure 23:
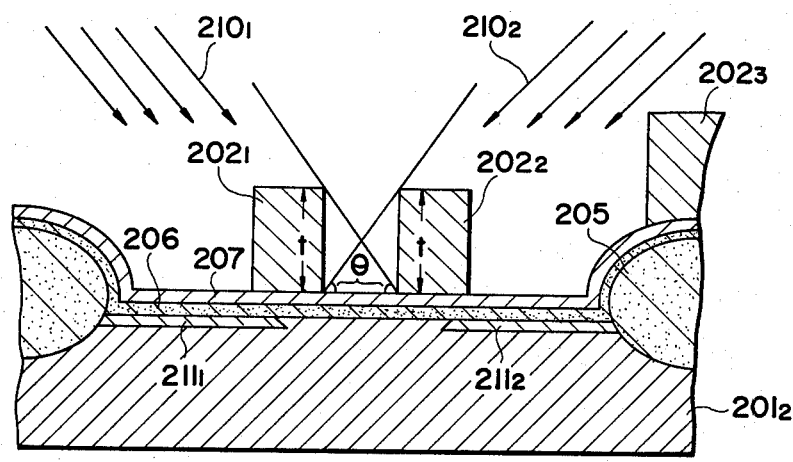
Figure 24:
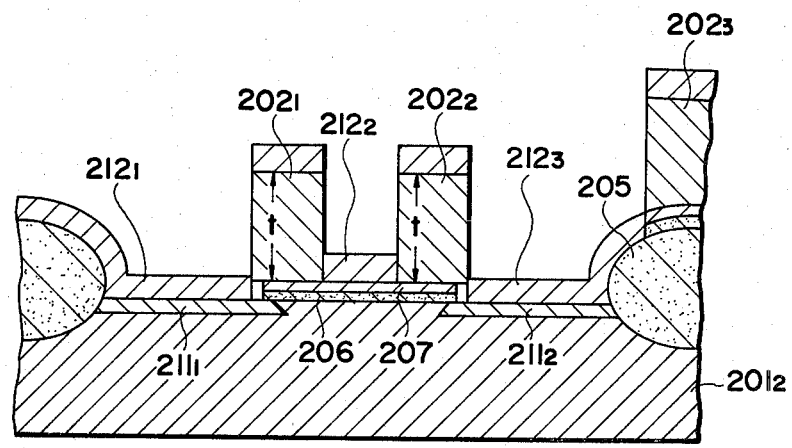

Thereafter, as shown in FIG. 23, the parallel ion beams $210_1$ and $210_2$ of n-type impurities such as phosphorus, arsenic or antimony are applied to the substrate at an angle smaller than $\theta = \tan^{-1} t/L$ from the left and the right, respectively, thereby to form the drain region $211_1$ and the source region $211_2$ where the n-type impurity ions have been implanted. Then, the parallel ion etching beams are applied to the substrate thus treated in the same direction and at the same angle, thereby to remove the polycrystalline layer 207 and the $SiO_2$ layer 206 from the surfaces of the drain $211_1$ and the source region $211_2$ as shown in FIG. 24.

Metals $212_1$ through $212_3$ such as aluminum, molybdenum, platinum, gold or chromium and, in the case where a heat treatment process is effected later, such as molybdenum or tungsten are deposited through vacuum evaporation in a vertical direction. Then, the ion etch resists $202_1$ through $202_3$ are dissolved with a solvent in accordance with the lift technique, and the vacuum-evaporated metals at the unnecessary portions other than the source, drain, and gate regions are removed as shown in FIG. 25.

Figure 25:
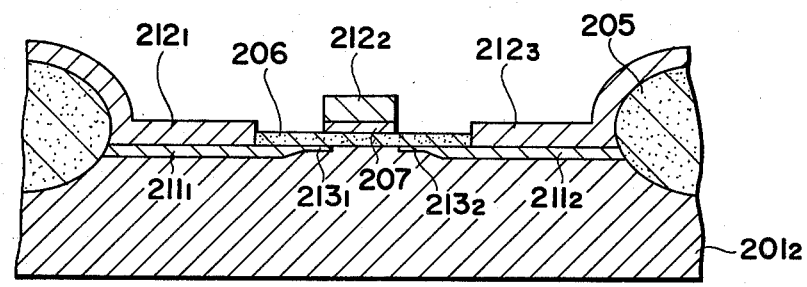

In addition, as shown in FIG. 25, the polycrystalline Si layer 207 exposed by using the metals $212_1$ through $212_3$ as a mask, which have been left as electrodes, is removed, and thereafter n-type impurity ion beams 210 are implanted vertically thereby to form n-type ion implantation layers $213_1$ and $213_2$, as a result of which the drain layer and the source layer are obtained. The fundamental structure of the MOS transistor is obtained by the above-described processes.

An application of the present invention to a manufacture of a semiconductor memory device will be described with reference to FIGS. 26 through 33.

There are a static type semiconductor memory device and a dynamic type semiconductor memory device. In the case where it is intended to provide a high density memory, a memory cell forming memory units each composed of one transistor and one capacitor has been used.

Figure 26:
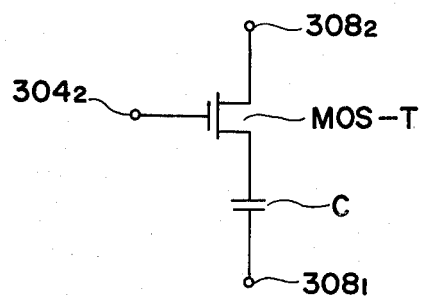
FIG. 26 is an equivalent circuit of a unit element forming a conventional semiconductor memory device.

Shown in FIG. 26 is an equivalent circuit diagram of a semiconductor memory unit of this type. This semiconductor memory unit comprises one MOS transistor MOS-T and one capacitor C.

Figure 27:
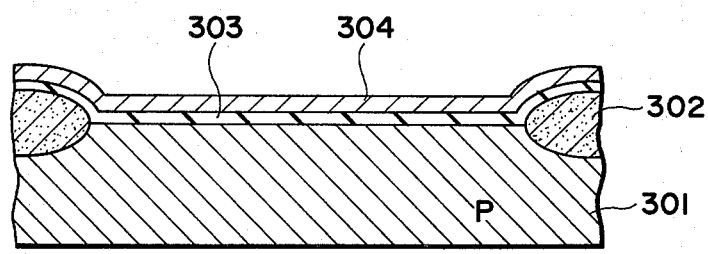
FIGS. 27 through 33 are cross sections showing a semiconductor memory device for a description of a fifth embodiment of the present invention.

As shown in FIG. 27, a surface of a p-type Si substrate except for the parts which will be employed as the source, drain, gate and capacitor regions is covered with a thick insulating and isolating oxide film regions 302 for the purpose of electrically isolating unitary elements. Then, an oxide film 303 which will be employed as a gate oxide film and a capacitor insulating film is formed by thermal oxidation or the like, and a polycrystalline Si film 304 is formed by vapor growth.

Figure 28:
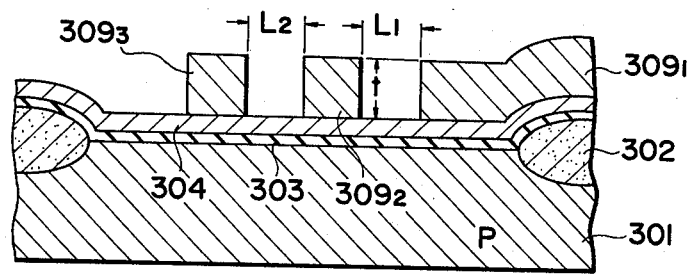

Then, as shown in FIG. 28, the polycrystalline Si film 304 is coated with a light exposing resist, an electron beam exposing resist, or an X-ray exposing resist. The resist is exposed to light or X-rays through a mask having a planar configuration or directly to electron beams and removed partially to form resist films $309_1$, $309_2$ and $309_3$ which are the walls of a pattern having openings in the drain, gate and capacitor regions.

Figure 29:
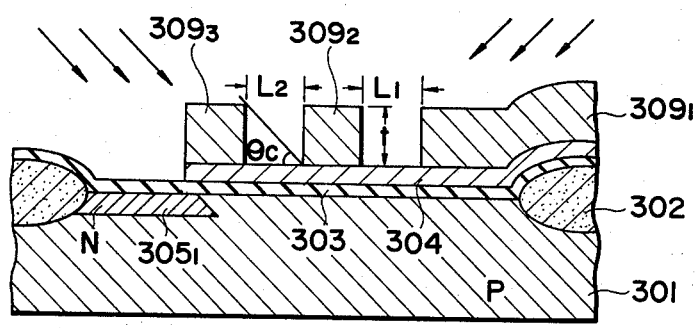

The distance between the resist films $309_1$ and $309_2$ is $L_1$, while the distance between the resist films $309_2$ and $309_3$ is $L_2$. The relation between these two distances $L_1$ and $L_2$ is $L_1 = L_2$. The thickness of the resist films is t. As shown in FIG. 29, parallel etching ion beams are applied to the Si substrate 301 at an angle smaller than $\theta_c = \tan^- t/L_1$ thereby to remove a part of the polycrystal Si film 304. The portions beneath the resist film $309_1$ through $309_3$ and the regions between the resist films are not etched because the portions and the regions are in the shadows of the resist films $309_1$, $309_2$ and $309_3$; that is, only a part of the polycrystal Si film 304 corresponding to the drain region is removed by the etching ions. Similarly as in this ion etching, n-type impurity ions are implanted obliquely thereby to form an n-type layer $305_1$ which is employed as a part of the drain region.

Figure 30:
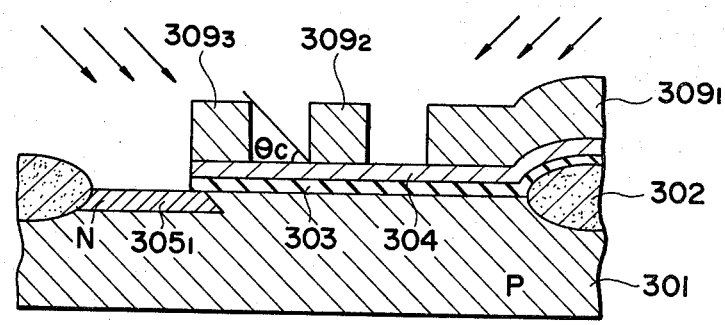

Then, similarly as in the above-described ion etching, parallel etching ion beams are applied at an angle smaller than $\theta_c$ thereby to remove the oxide film 303 on the n-type layer $305_1$ which will become a part of the drain region, as shown in FIG. 30.

Figure 31:
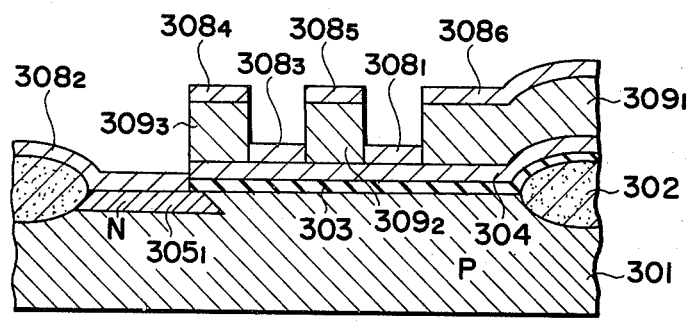

As shown in FIG. 31, metal films $308_1$ through $308_6$ for electrodes are deposited over the entire surface of the Si substrate 301 by vacuum evaporation.

Figure 32:
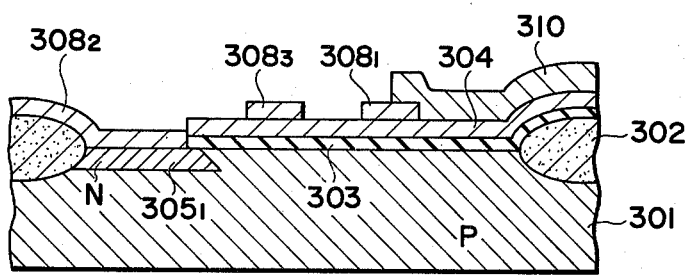

Then, the resist films $309_1$ through $309_3$ are removed by the lift off technique, as a result of which only the metal films $308_1$, $308_2$ and $308_3$ respectively for the source electrode, the drain electrode and the gate electrode are left as shown in FIG. 32. The entire surface is coated with a resist 310, and the polycrystal Si film 304 is removed with the openings between the metal films $308_1$ and $308_3$ and between the metal films $308_2$ and $308_3$. The mask required for this operation may be a simple one which is formed so as to leave the resist on the right side of the metal film $308_1$ as a resists 310 and to change the left side thereof into an opening, as shown in FIG. 32.

Figure 33:
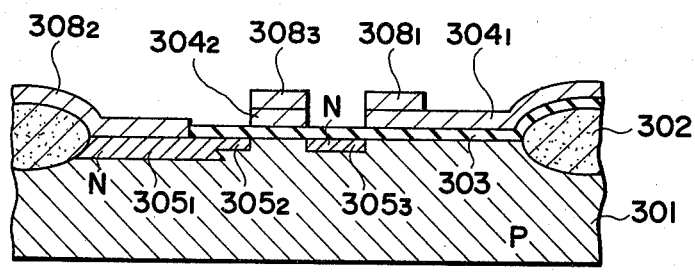

As shown in FIG. 33, implantation or diffusion of n-type impurity ions is effected from above thereby to form a n-type layer $305_2$ which is a part of the source region and to from a n-type lauyer $305_3$ which is a part of the drain region.

Then, an oxide film is formed over the entire surface by vapor growth. Thereafter, the oxide film is coated with a resist, and predetermined portions thereof are subjected to light exposure for providing external electrodes. Then, openings are formed so that the oxide film beneath the openings is subjected to etching, thereby to complete a semiconductor memory device. In the case where it is necessary to provide metal film multi-layer wiring, a metal film is further formed over the entire surface, and a metal wiring pattern is formed by photo-etching.

Heretofore, it is necessary to form four masks; however, according to this embodiment the number of masks is reduced to three: the mask for forming the insulating and isolating oxide film 302, the mask for forming the resist films $309_1$ through $309_3$ (FIG. 28), and the mask for forming the resist 310 (FIG. 32). The mask for forming the resist 310 is considerably simple because it is merely used for providing the boundary of the resist on one metal film $308_1$ as shown in FIG. 32. It is unnecessary to carry out the alignment of the mask with high accuracy. The alignment of the drain, gate, source and capacitor regions and the alignment of the metal film for the electrodes thereof are of the self-alignment type which can be defined by only one mask employed for forming the resist films $309_1$ through $309_3$. Accordingly, this alignment is undoubtedly higher in accuracy than the conventional alignment where four masks are used. Therefore, the present invention is advantageous in miniaturization and performance improvement of a semiconductor memory device.

In the etching of the polycrystal Si film 304 and the oxide film 303 and/or the forming of the n-type layer $305_1$ forming one part of the drain region in the above-described example, a method may be employed in which instead of the aformentioned oblique ion application, a radiation such as light, X-rays or electrons is applied obliquely thereby to form a mask for etching or n-type impurity diffusion on the Si substrate 301, the mask being used for etching predetermined regions or introducing impurities into the same. In this case also, the mask pattern is formed in accordance with the resist films $309_1$ through $309_3$. Therefore, it is unnecessary to provide an additional exposure mask, and similarly as in the above-described embodiment the alignment of the various sections of the MOS transistor and the capacitor electrode is of the self-alignment type defined by only the pattern of the resist films $309_1$ through $309_3$. Accordingly, this method is also advantageous in miniaturization and performance improvement of a semiconductor memory device. In the above-described embodiment, the resist films $309_1$ through $309_3$ are employed as the walls capable of shielding the radiations such as light, X-rays and electrons, or ion beams; however, an oxide film, a polycrystal Si film, a metal film, an ion etch resist film, or other films which may be formed on a semiconductor substrate can be employed as the aforementioned walls similarly. The manufacturing method according to this invention can be applied not only to the semiconductor memory device obtained by combining the MOS transistor and the capacitor but also to other semiconductor memory devices having structures equivalent to that of the former.

As is clear from the above description, according to this invention, one pattern consisting of a pattern portion for forming the transistor and a pattern portion for forming the capacitor is constituted by the walls capable of shielding radiations such as light, X-rays and electrons or ion beams, and the oblique incidence of impurity ions, etching ions or radiations such as light, electrons and X-rays results in the formation of a pattern for impurity introduction regions and of a pattern for etching regions.

This invention can be extensively applied not only to the manufacture of the described devices, but also the manufacture of other semiconductor devices, solid-state devices and solid-state element.

As is apparent from the above detailed description, according to this invention, the etching pattern and/or impurity introduction pattern can be determined not only by the resist pattern but also by the incidence direction and incidence angle of the parallel beams. Therefore, the pattern can be employed as masks or patterns is other processes.

Thus, the number of masks and patterns required in the manufacture of solid-state devices and solid-state elements can be reduced, and the alignment of components thereof can be obtained with high accuracy.

What is claimed is:

1. A method of manufacturing a planar type semiconductor device having a monocrystalline semiconductor substrate of one conductivity type and having at least one intermediate region different in properties from side regions on both sides thereof, comprising the steps of:
   (a) forming a base, said base forming step including at least the forming of an oxide layer on one surface of said substrate;
   (b) forming a resist layer on said base, said resist layer having a thickness t;
   (c) selectively removing said resist layer to form a desired pattern including at least a pair of pattern portions spaced apart by a distance L substantially corresponding to the width of said intermediate region to form a window;
   (d) introducing impurities of the other conductivity into said side regions of said substrate by irradiating said substrate with impurity ion beams obliquely at an angle equal to or less than $\tan^{-1}(t/L)$ with respect to said substrate surface;
   (e) removing said oxide layer on said side regions by irradiating said substrate with etching ion beams at the same angle as in step (d) to form contact holes on said side regions;
   (f) depositing ohmic electrode material over said substrate surface;
   (g) removing said resist pattern portions; and
   (h) said method further comprising the step of irradiating said substrate with vertical impurity ion beams of the other conductivity type.

2. The method as defined in claim 1 wherein said base forming step consists of the forming of an oxide layer on one surface of said substrate, wherein the first-mentioned impurity introducing step results in the formation of source and drain regions and wherein said irradiation with vertical impurity ion beams is performed after said resist removing step.

3. The method as defined in claim 1, wherein said base forming step comprises the forming of an oxide layer on one surface of said substrate followed by the forming of a conductive layer on said oxide layer, wherein the first-mentioned impurity introducing step results in the formation of source and drain regions, wherein the conductive layer underlying said resist pattern portions is removed in said resist removing step, and wherein the irradiation of said substrate with vertical impurity ion beams is performed after said resist removing step.

4. The method as defined in claim 1, wherein said base forming step comprises the forming of an oxide layer on said substrate followed by said step of irradiating said substrate with vertical impurity ion beams of said other conductivity type, said method further comprising the step, immediately prior to said oxide removing step, of implanting ions of said one conductivity type into said window area by irradiating said window area with vertical ion beams.

* * * * *